United States Patent
Light et al.

(10) Patent No.: US 6,333,207 B1
(45) Date of Patent: Dec. 25, 2001

(54) PEELABLE LEAD STRUCTURE AND METHOD OF MANUFACTURE

(75) Inventors: David Light, Los Gatos; John W. Smith, Palo Alto, both of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/577,474

(22) Filed: May 24, 2000

Related U.S. Application Data (60) Provisional application No. 60/135,634, filed on May 24, 1999.

(51) Int. Cl.[7] .......................... H01L 21/44; H01L 21/48; H01L 21/50
(52) U.S. Cl. ....................... 438/106; 438/118; 438/611; 438/612; 438/617
(58) Field of Search ................................. 438/106, 118, 438/611, 617, 612; 228/180.5, 180.21

(56) References Cited

U.S. PATENT DOCUMENTS

| Re. 35,119 | 12/1995 | Blonder et al. ............... 257/739 |
|---|---|---|
| 3,665,589 | * 5/1972 | Farrell |
| 3,825,353 | 7/1974 | Loro ............................... 317/234 |
| 5,518,964 | 5/1996 | DiStefano et al. ............ 437/209 |
| 5,763,941 | 6/1998 | Fjelstad ......................... 257/669 |
| 6,110,761 | * 8/2000 | Ahmad |
| 6,221,749 | * 4/2001 | Kirloskar et al. |

FOREIGN PATENT DOCUMENTS

WO/94/03036  2/1994  (WO) ...................... H05K/3/36

* cited by examiner

*Primary Examiner*—John F. Niebling
*Assistant Examiner*—Josetta Jones
(74) *Attorney, Agent, or Firm*—Lerner, David, Littenberg, Krumholz & Mentlik, LLP (57) ABSTRACT

A microelectronic component connection is made by providing a lead, extending along the surface of a first element such as a semiconductor chip or wafer, such that at least a part of the lead adheres to the surface of the first element. The adhesion between this part of the lead and the surface of the first element is released by altering the temperature of at least this part of the lead. This part of the lead can then be peeled away from the surface of the first element. This part of the lead may be connected to a second element such as a microelectronic connection component, and the lead may be deformed by moving the elements relative to one another.

47 Claims, 3 Drawing Sheets

PEELABLE LEAD STRUCTURE AND METHOD OF MANUFACTURE

CROSS-REFERENCE TO RELATED APPLICATIONS

The present application claims benefit of U.S. Provisional Patent Application No. 60/135,634 filed May 24, 1999, the disclosure of which is hereby incorporated by reference herein.

BACKGROUND OF THE INVENTION

As described in certain embodiments of U.S. Pat. No. 5,518,964, the disclosure of which is incorporated by reference herein, an element used in a microelectronic assembly may have elongated flexible leads extending along a surface of the element. Each lead has a first or terminal end permanently attached to the element and has a tip end offset from the terminal end. A second element having contacts thereon is engaged with the first element so that the tip ends of the leads are bonded to contacts on the second element. The first and second elements are then moved away from one another so as to deform the leads and provide vertically extensive leads extending between these elements. A compliant material may be introduced between the elements during or after such motion. The resulting structure allows relative movement of the elements without substantial stresses on the leads. This process can be used, for example, to make packaged semiconductor chips. One of the elements may be a connection component desirably having a flexible structure incorporating one or more dielectric layers, and the other one of the elements may be a chip, wafer or assemblage of chips. The leads may be provided either on the connection component or on the chips or wafer.

As described in U.S. Pat. No. 5,763,941, the disclosure of which is also incorporated by reference herein, a releasable lead structure may be made by providing a first region of a lead permanently connected to a component and a second region releasably connected to a surface of the component so that the second region can be peeled away from such surface. Desirably, the second region is attached to the underlying surface by a release interface having a peel strength of less than about $0.35 \times 10^6$ dynes/cm; i.e., a peel strength of less then about 2 lbs. per linear inch. For example, certain low-energy vapor deposition processes such as electroless plating or chemical vapor deposition can deposit a thin layer of release metal forming a release interface with the underlying layer. The lead may incorporate a structural metal which may be the same as or different from the release metal. The release metal can be peeled away from the underlying layer. In other embodiments, the interface may include a layer of a first release metal securely bonded to the underlying layer and a second release metal on the lead, the first and second release metals being weakly bonded to one another so that the second region of the lead can be pulled away from the underlying layer, with the first release metal remaining on the underlying layer.

SUMMARY OF THE INVENTION

One aspect of the invention provides a method of making a microelectronic connection component. The method according to this aspect of the present invention preferably includes providing a first element having a surface and a lead extending along the surface having a first end and a second end. The first element may be a microelectronic element such as a wafer, including plural semiconductor chips, a semiconductor chip, or a connection component. When the first element is a wafer, the wafer may be severed to form a plurality of individual units. The second end of the lead preferably adheres to the surface of the first element. Desirably, the adhesion between the second end of the lead and the surface is released by altering the temperature of at least the second portion of the lead. Preferably, the step of altering the temperature includes heating the second end of the lead.

The second end of the lead may be moved away from the surface, typically after the adhesion is released. Preferably, a plurality of leads are provided on the first element. For example, a second element having electrically conductive features may be juxtaposed with the first element, and the second ends of the leads may be bonded to conductive features of the second element. The second element may include a dielectric substrate. Desirably, the step of moving the second ends of the leads includes moving the first and second elements away from one another. In preferred processes according to this aspect of the invention, the second ends of the leads are retained in position during the early stages of the process, but the second ends are released to allow relative movement of the first and second elements. In the most preferred forms of the process, it is not necessary to provide small frangible elements to temporarily secure the second ends of the leads. This simplifies the manufacture of the components used in the process.

Heating may be performed by heating at least one of the elements to thereby heat all of the leads simultaneously. Desirably, the heating which releases the adhesion of the second ends of the leads also serves to activate a bonding material which bonds the second ends of leads to the conductive features of the second element. The elements may be subjected to at least one post-bonding heating step after the second ends of the leads have been bonded to the conductive features of the second element but before moving the elements away from each other. Desirably, the post-bonding heating contributes to the release of the adhesion of the second ends to the first element. In other embodiments, heating to release adhesion is performed cyclically by locally heating less than all of the leads during each cycle so as to release the adhesion between the second ends of some leads while leaving other bonds intact. The local heating may be performed, for example, by directing radiant energy in the vicinity of the leads to be heated during each cycle to thereby release the adhesion between the second ends of these leads and the first element. Each heated lead may be engaged with a bonding tool concomitantly with the release of the adhesion of that lead. Desirably, the first end of each lead is permanently attached to the first element.

A further aspect of the invention provides a method of bonding a lead to a contact. The method of this aspect of the invention preferably comprises providing a lead, preferably an elongated lead, having a portion at least partially overlying a contact and a bonding material on at least one of the lead or the contact. The bonding material is liquefied so that the liquid bonding material forms a droplet in contact with the lead and the contact, desirably wetting the lead and the contact, so that the bonding material moves at least that portion of the lead adjacent the contact relative to the contact so as to increase the degree of overlap between the lead and the contact. Although the present invention is not limited by any theory of operation, it is believed that the surface tension of the bonding material pulls that portion of the lead adjacent the contact into better alignment with the contact.

The lead may bend or flex during movement under the influence of the forces applied by surface tension. For example, the lead may be provided with a fixed end attached to a first element and a tip end movable with respect to the first element, whereas the contact is provided on a second element. In certain embodiments, the tip end of the lead is initially adherent to the first element but is rendered movable by releasing the adhesion in the manner discussed above. Preferably, it is the tip end of the lead that is wetted by the liquefied bonding material. After the bonding material is liquefied, a bond forms between the lead and the contact. The lead may be further deformed by moving the first and second elements away from one another.

The first element may bear plural leads, whereas the second element may have plural contacts. Movement of the leads provides some degree of compensation for misalignment between the various leads and contacts. This reduces the need for precision in placement of the leads and contacts on the first and second elements.

Yet another aspect of the invention provides a method of making a microelectronic assembly. The method of this aspect of the invention preferably comprises providing a dielectric substrate having a first surface and a lead adhered to the first surface at least at a tip end of the lead. Desirably, the tip end of the lead is connected to an electrical contact on a contact-bearing surface of a microelectronic component to create a microelectronic assembly. Preferably, the temperature of the tip ends of the leads and substrate are altered through a temperature range sufficient to cause the tip end of the lead to separate from the first surface of the substrate. The step of altering the temperature may include heating and/or cooling the leads and the substrate. The substrate may have a plurality of leads adhering to the first surface at least a terminal and a tip end of each lead, and the microelectronic component may have a plurality of lead-bonding contacts on the contact-bearing surface. Preferably, the tip ends of the leads are connected to associated lead-bonding contacts prior to or during the temperature altering. Each tip end may separate from the substrate first surface as the temperature of the leads and the substrate is altered.

The substrate may have terminals exposed at a second surface of the substrate opposite the first surface. Some or all of the terminals may be electrically connected to some or all of the leads. In a simple embodiment, the terminals extend from the first surface to the second surface of the substrate. The substrate may include additional conductive elements such as traces or conductive planes. To form a chip-size package, at least some of the terminals are disposed above the contact-bearing surface of a chip incorporated in the microelectronic elements. Preferably, a flowable, conductive material is provided on the terminals for further connection to a system substrate. A terminal end of each lead, remote from the tip end of such lead, may be connected to each terminal.

The microelectronic element may include a plurality of semiconductor chips, and the leads on the substrate may be connected to the plurality of semiconductor chips. For example, the microelectronic component may be a semiconductor wafer or other elements including a plurality of individual chips each having a plurality of contacts thereon.

DETAILED DESCRIPTION OF THE PREFERRED EMBODIMENTS

Figure 1:
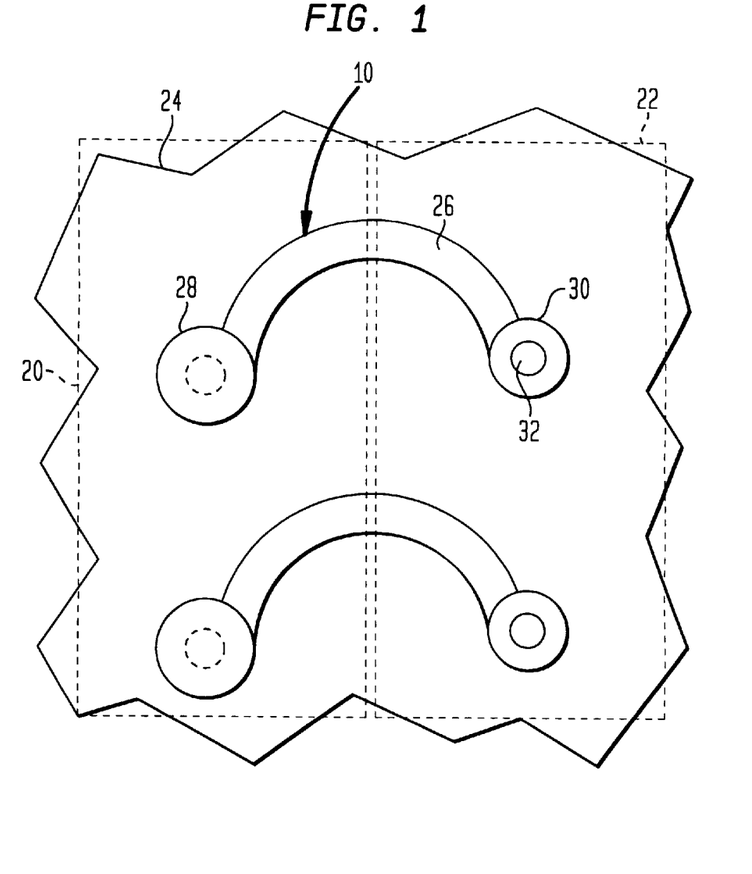
FIG. 1 is a plan view of a connection component during a manufacturing process, in accordance with certain preferred embodiments of the present invention.
Figure 2:
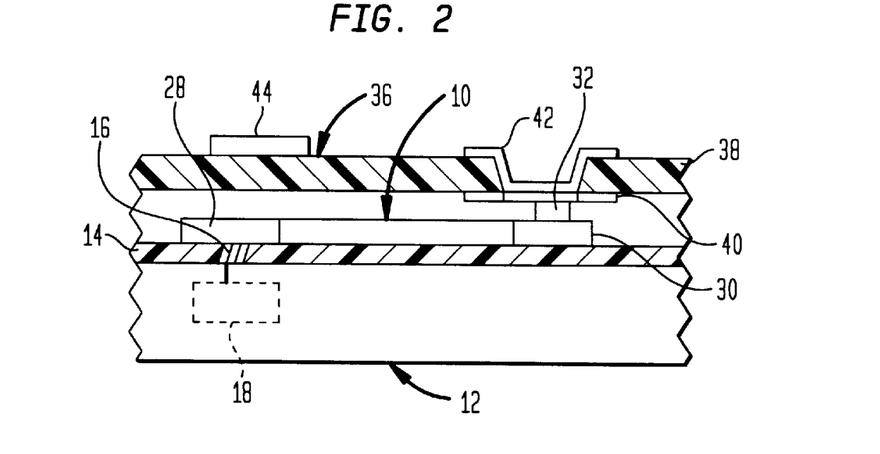
FIG. 2 is a fragmentary cross-sectional view of the connection component shown in FIG. 1 during a manufacturing process.

In a process according to one embodiment of the present invention, illustrated in FIGS. 1 and 2, releasable leads 10 are provided on a surface of first element as, for example, on a surface of a semiconductor chip or wafer 12. Each releasable lead 10 is comprised of a conductive material such a gold. Each lead desirably is about 1000 microns or less long, about 25 microns or less thick, and about 50 microns or less wide. For example, leads between about 200 microns and about 1000 microns long, about 10 microns to about 25 microns thick and about 10 microns to about 50 microns wide can be used. Wafer 12 has a top surface defined by a passivation layer 14, which may be a polymeric material such as a polyimide. The passivation layer has openings at contacts 16 of the wafer. In the conventional manner, the contacts 16 are connected to internal structures 18 such as electronic devices within the chip or wafer. A first region 20 of the top surface is treated with a tie-coat whereas a second region 22 is not so treated. The tie-coat may include nickel, chromium, a nickel-copper alloy such as Monel® or another suitable alloy vacuum deposited or sputter-deposited on the polyimide surface of layer 14 under conditions which promote adhesion of the tie-coat. The tie-coat may be about 10 Angstroms to about a few hundred Angstroms thick. After formation of the tie-coat, leads 10 are formed by depositing copper, gold, or other suitable lead-forming material on the surface, so that the lead includes a first region 24 overlying the tie-coat and a second region 26 which does not overlie the tie-coat. Each lead 10 has a first or terminal end 28 in the first region 24 and a second or tip end 30 in the second region 22. Bonding material 32 may be applied on the tip end 30 of the lead 10. For example, the bonding material 32 may be a bonding material of the type adapted to form a liquid phase during, the bonding process as, for example, solder or a eutectic bonding alloy. Portions of the tie-coat not covered by leads 10 are removed as, for example, by a brief etching procedure.

In the next step of the process, the first element or chip 12 bearing leads 10 is united with a second element 36 such as a microelectronic connection component incorporating a support structure 38 such as a dielectric layer, or multi-layer dielectric structure having lead-bonding contacts 40 on a surface. The lead-bonding contacts 40 are connected to other conductive features on support structure 38 as, for example, terminals 42 exposed for connection at the side of the support facing away from the chip or wafer 12. The particular terminal structure 42 illustrated in FIG. 2 is a simple via directly connected to a lead-bonding contact 40. However, the electrically conductive features on the support structure may include other elements such as electrically conductive potential plane 44, located at the side of the support structure 38 facing away from the chip or wafer 12. While FIG. 2 shows just one electrically conductive potential plane 44, a plurality of potential planes may be located at the side of the support structure 38 facing away from the chip or wafer 12. An electronically conductive plane or planes may also be located on the support structure 38 facing towards the chip or wafer 12. If the support structure is comprised of a multi-layer dielectric structure, one or more electrically conductive potential planes may be located between the dielectric layers. Traces may also extend along one or more surfaces of the support structure or within the support structure in horizontal directions parallel to the surfaces of the support structure and other connections.

The surface of element 36 bearing lead-bonding contacts 40 is juxtaposed with the lead-bearing surface of element 12, and the tip or second ends 30 of the leads are aligned with lead-bonding contacts 40. The second ends of the leads are bonded to contacts 40. The second region 26 of each lead initially has adhesion to layer 14 similar to the first region 24. However, upon thermal cycling as, for example, upon heating of the unit to about 120–150° C., the adhesion between the second portion of each lead and the underlying layer degrades substantially, whereas the adhesion of the first portion of the lead to the underlying layer does not substantially degrade. While the present invention is not limited by any theory of operation, it is believed that this degradation arises at least in part from mechanical stress due to differences in thermal expansion breaking the bond between the lead and the underlying layer. Typically, the bonding material 32 is a heat-activated bonding material and the elements are heated before engagement with one another to activate the bonding material. The same heating step which activates the bonding material also serves to degrade the bond between the tip ends of the leads and the surface of first element 12. As described in greater detail in the co-pending, commonly assigned application Ser. No. 09/317,675 entitled "Microelectronic Unit Forming Methods and Materials" filed May 24, 1999 and naming John Smith, Belgacem Haba, and others as inventors, (hereinafter "the Smith et al. application"), the disclosure of which is incorporated by reference herein, contact 40 desirably is larger than the tip end 30 of the lead. As more fully described therein, this arrangement substantially increases the misalignment tolerance of the process.

Figure 3:
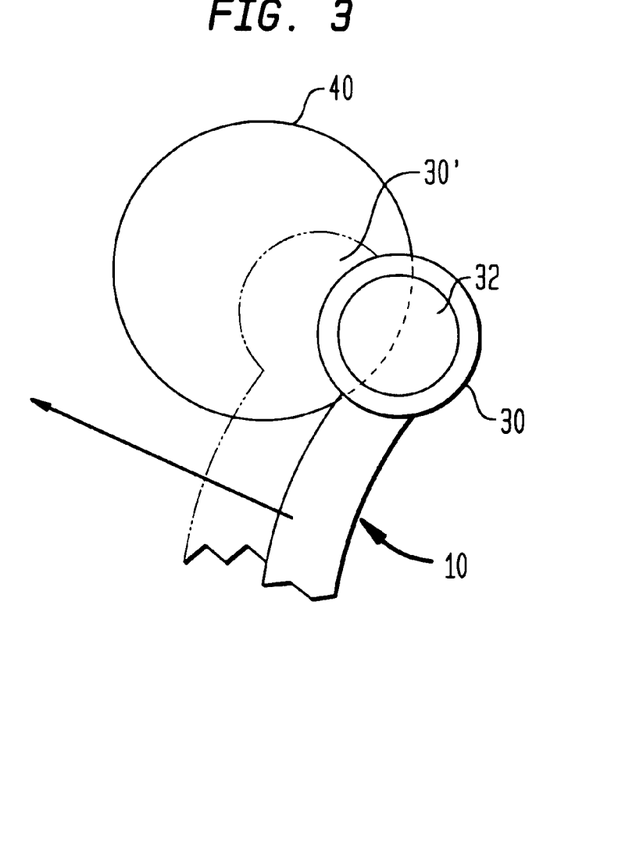
FIG. 3 is a fragmentary plan view on an enlarged scale of the connection component of FIGS. 1 and 2 depicting certain features of the embodiment shown during the manufacturing process.

Upon cooling, the bonding material solidifies. As also explained in greater detail in the Smith et al. application, the use of lead-bonding contacts 40 having relatively large diameter facilitates registration of the lead tip ends with the contacts. Moreover, lead-bonding contacts 40 on the connection component may be spaced at larger intervals than the contacts on a chip or wafer. The tip end 30 of each lead moves due to surface tension effects in the liquefied bonding materials 32. As schematically shown in FIG. 3, the lead may initially be placed in a partially misaligned condition, depicted in solid lines, such that there is only a small region of overlap between the tip end 38 of the lead and the lead-bonding contact 40. A portion of the liquefied bonding material 32 is disposed in the area of overlap between the tip end of the lead and the contact, and wets both of these elements. At this stage of the process, the remainder of the bonding material is disposed outside of the area of overlap. Therefore, surface tension tends to pull the liquefied bonding material into the relatively small space between the tip end and the contact, and into the area of overlap. This action also moves the tip end of the lead, ultimately bringing the tip end of the lead to a fully aligned condition depicted in broken lines in FIG. 3 at 30'. Even in an embodiment where a liquefied bonding material is not used, the lead-bonding contacts 40 make electrical connection with the lead tip ends over a wide range of tip end positions and provide a relatively large degree of overlap between the lead tip ends and the contacts over this wide range of lead tip end positions.

Figure 4:
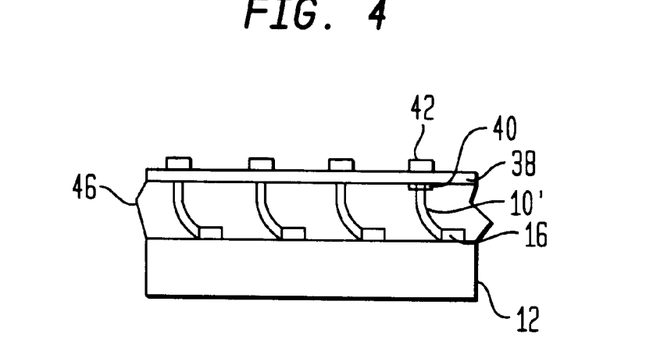
FIG. 4 is a fragmentary cross-sectional view of the connection component and microelectronic element after the leads have been connected to contacts on the microelectronic element.

After the tip ends of the leads have been bonded to the contacts, the first element 12 and second element 38 are moved away from one another through a pre-selected displacement so as to deform the leads towards a vertically extensive disposition. Because the second or tip ends of the leads have been released from the surface of the first element 12, they are free to move during this process. During or after movement of the elements, a flowable composition is injected between the elements and around the leads so as to form a dielectric layer, desirably a compliant dielectric layer such as a gel, elastomer or foam. These steps can be conducted as described in U.S. Pat. No. 5,518,964 and in the Smith et al. application. As shown in FIG. 4, the resulting structure has flexible leads 10' extending through the compliant dielectric layer 46 and connecting the lead-bonding contacts 40 on support structure 38 with the contacts 16 on the chip or wafer 12. Thus, the terminals 42 on support 38 are connected to the appropriate contacts of the chip or wafer. Where the first element 12 is a wafer or other assemblage of plural chips, the components may be severed so as to form individual units, each including a single chip or a set of chips together with the associated portions of support structure 38 and the associated terminals 42. The resulting structure thus provides a packaged semiconductor chip which can be mounted to a circuit board or other system substrate by bonding terminals 42 to the contact pads of the substrate. Solder or other conductive bonding material may by applied on the terminals for this purpose. During use, the compliant dielectric layer 46 and flexible leads 10' allow movement of the support structure 38 relative to the chip 12. This allows movement of the chip relative to the system substrate. Such movement may compensate for differential thermal expansion during service of the assembly and/or during the manufacturing processes. The particular package illustrated in FIG. 4 is a chip-size package. At least some of the terminals 42 are disposed in the region. of the support structure 38 overlying the chip. The support structure 38 may be about the same area as the chip itself. Other configurations, in which the support structure is larger than the chip, also can be employed.

In other variations, the same process may be conducted with individual chips and individual sections of the dielectric layer, so that the process yields individual packaged semiconductor chips without any subsequent severing step. In a further alternative, where the support structure 38 includes elements such as electrically conductive traces, a set of plural chips is connected to the support structure so that the leads, in cooperation with the traces, interconnect the various chips of the set. Thus, the finished product is a multichip module incorporating the plural chips of the set connected to one another. Desirably, the support structure includes terminals such as terminals 42 for connecting the module to a larger system.

In a variant of the processes discussed above, the lead second ends 30 are bonded to the contacts 40 on the opposing element and the assembly is subjected to additional thermal treatment, such as additional heat or cooling, to degrade the adhesion between the lead second ends and the first element 12 after bonding to the contacts. Stated another way, the adhesion between the lead second ends and the underlying layer may be strong enough to survive the thermal cycling associated with the bonding process, or the bonding process may be conducted with no thermal cycling or with minimal thermal cycling, using bonding materials adapted to form bonds at relatively low temperatures. After, the tip ends of the lead have been bonded to the lead-bonding contacts, the additional thermal cycling loosens the bonds between the tip ends of the leads and the underlying surface, so that the elements can be moved away from one another and the leads deformed towards a vertically extensive disposition as discussed above.

In a further variant, the tie-coat applied in first region 20 may be omitted. Thus, the first ends of the leads may be affixed to the underlying layer principally by their attachment to other structures extending into such layer, as, for example, by the attachment between the first end 28 of lead 10 and the contact 16 of chip 12. Here again, the second end 30 of each lead is held in place by attachment to the underlying layer so that the lead tip ends are held in place while their components are juxtaposed with one another. This facilitates alignment of the lead tip ends with the contacts.

In a further variant, the leads may be provided on a surface of a connection component such as a flexible or rigid dielectric substrate and may be bonded to the contacts on a chip or wafer. In yet another variant, the heating process may include application of energy through one or more of the components. For example, infrared energy may be applied through the thickness of the chip or wafer as by applying infrared energy at a wavelength readily transmitted through silicon to the rear surface of the chip or wafer so that the infrared radiation passes through the chip or wafer to the leads and the components surrounding the leads.

Figure 5:
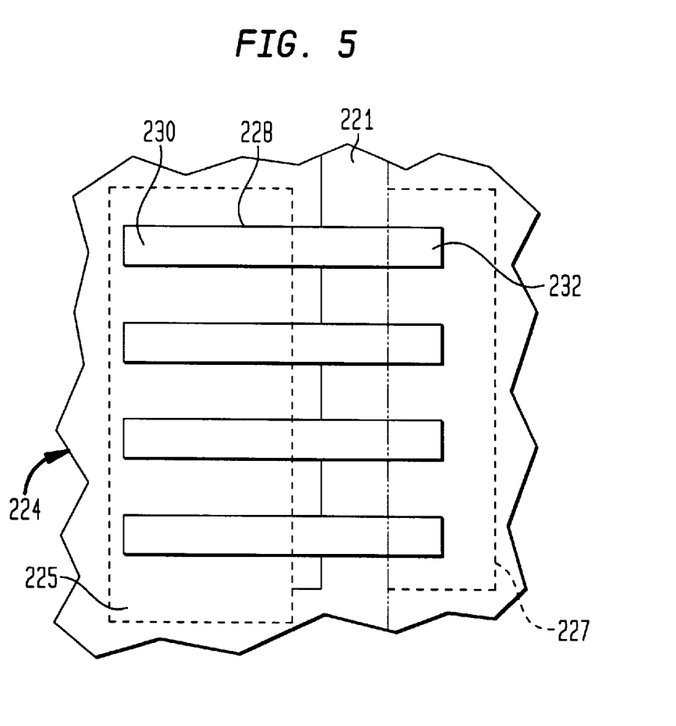
FIG. 5 is a fragmentary plan view of a connection component during a manufacturing process, in accordance with another preferred embodiment of the present invention.
Figure 6:
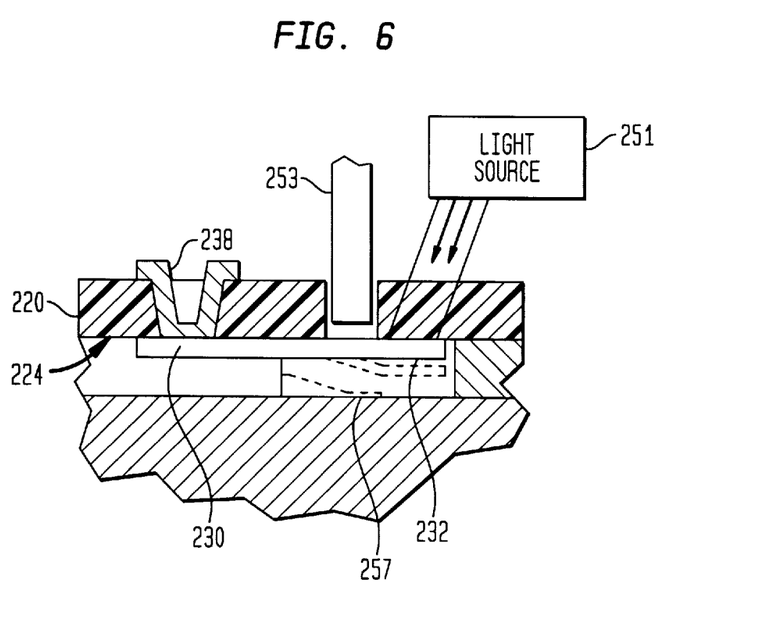
FIG. 6 is a fragmentary, cross-sectional view of the connection component of FIG. 5 during a manufacturing process.

A connection component according to a further embodiment of the invention, partially illustrated in FIGS. 5 and 6, includes a support structure or dielectric layer 220 having an elongated gap 221 extending through the dielectric layer. Leads 228 extend across the gap. The general layout of the dielectric layer and leads may be as disclosed in the International Patent Publication WO/94-03036, the disclosure of which is hereby incorporated by reference herein. Each lead includes a first region 230 on one side of the gap securely connected to dielectric layer 220 and a second region 232 on the opposite side of the gap. In this configuration as well, the bottom surface 224 of the dielectric layer may have a first zone 225 treated to enhance adhesion between the lead and the bottom surface, a second zone 227 with relatively low adhesion, or both. Alternatively or additionally, a via liner 238 or other mechanical fastener may permanently secure the first region of the lead to the support structure, and the relatively weak bond between the surface of the lead and the support structure 220 may extend throughout the first region of the lead as well as the second region.

In a method according to a further embodiment of the invention, the support structure is positioned over a microelectronic component 242, such as a semiconductor chip, and a compliant layer 231 is provided between the polymeric layer and the microelectronic element. As disclosed in the aforementioned '036 publication, a bonding tool 253 is advanced downwardly into gap 221, thereby engaging the lead and forcing the lead downwardly, to the position illustrated in broken lines at 228' in FIG. 6. As the bonding tool forces the lead downwardly, the second region 232 of the lead which is being engaged by the bonding tool is locally heated, as by directing intense light or other radiation from a laser, lamp or other suitable source 251 through the support structure 220 to the interface between the lead and support structure 220. Thus, the adhesion between the second region 232 of each lead and the support structure is degraded at about the same time as that lead is engaged by the bonding tool 253. The lead is forced into engagement with a contact 257 on a chip or other device. The same cycle of operations is then repeated for the next lead. Each lead therefore is maintained in position until it can be engaged by the bonding tool, thus facilitating alignment between the leads and the bonding tool. The first region 230 remains securely bonded to the polymeric layer. In a variant of the process described above with reference to FIGS. 5 and 6, a small portion of each lead on the first side of the gap is releasably bonded to the polymeric layer. For example, such small portion may be irradiated by the light source when the second end of the lead is irradiated, thereby releasing the bond on the first side of the gap as well. This allows the lead to bend in a gradual manner at the gap and reduces any tendency to stress concentration at the bend.

In a variant of the processes discussed above, the bond between the lead second ends and the support structure may be relatively strong at room temperature but may degrade severely upon heating or irradiation. For example, the support structure may include a layer of a heat-degradable polymer or a thermoplastic at the interface between the lead surface and the support structure.

The disclosures of co-pending, commonly assigned U.S. patent applications Ser. No. 09/200,100 and 08/547,170 are hereby incorporated by reference herein.

As these and other variations and combinations of the features described above can be used without departing from the present invention, the foregoing description of the preferred embodiments should be taken by way of illustration rather than by way of limitation of the invention as claimed.

What is claimed is:

1. A method of making a microelectronic connection comprising:
   (a) providing a first element having a surface and a lead extending along such surface, said lead having a first end and a second end, said second end of said lead adhering to said surface; and
   (b) releasing the adhesion between the second end of the lead and the surface by altering the temperature of at least the second portion of the lead.

2. A method as claimed in claim 1 wherein said step of altering the temperature includes heating the second portion of the lead.

3. A method as claimed in claim 2 further comprising moving the second end of the lead away from the surface.

4. A method as claimed in claim 3 further comprising juxtaposing a second element having electrically conductive features thereon and bonding said second end of said lead to a conductive feature of said second element, said step of moving said second end of said lead including moving said first and second elements away from one another.

5. A method as claimed in claim 4 wherein a plurality of leads as aforesaid are provided on said first element.

6. A method as claimed in claim 5 wherein said heating is performed by heating at least one of said elements to thereby heat all of said leads simultaneously.

7. A method as claimed in claim 6 wherein said heating which releases the adhesion of the second ends of the leads also serves to activate a bonding material which bonds the second ends of leads to said conductive features of said second element.

8. A method as claimed in claim 6 wherein said elements are subjected to at least one post-bonding heating step after said second ends of said leads have been bonded to said conductive features of said second element but before moving said elements, and such post-bonding heating contributes to release of said adhesion of said second ends to, said first element.

9. A method as claimed in claim 2 wherein a plurality of leads as aforesaid are provided on said first element, and wherein said heating is performed cyclically by locally heating less than all of said leads during each cycle so as to release the adhesion between the second ends of some leads while leaving other bonds intact.

10. A method as claimed in claim 9 wherein said heating is performed by directing radiant energy in the vicinity of one said lead during each cycle to thereby release the adhesion between the second end of that lead and said first element.

11. A method as claimed in claim 10 further comprising the step of engaging each said lead with a bonding tool concomitantly with release of the adhesion of that lead.

12. A method as claimed in claim 1 wherein the first end of the lead is permanently attached to said first element.

13. A method as claimed in claim 1 wherein said first element includes at least one semiconductor chip.

14. A method as claimed in claim 1, wherein said first element is wafer.

15. A method as claimed in claim 14, wherein said wafer is severed to form a plurality of individual units.

16. A method as claimed in claim 1, wherein said second element is a dielectric substrate.

17. A method of bonding a lead to a contact comprising:
   (a) providing a lead partially overlying a contact and a bonding material on at least one of said lead and said contact;
   (b) liquefying at least a portion of said bonding material so that said liquid bonding material forms a droplet in contact with said lead and said contact and so that said bonding material moves at least that portion of the lead adjacent said contact relative to said contact so as to increase the degree of overlap of said lead and said contact.

18. The method as claimed in claim 17, wherein said bonding material forms a bond between said lead and said contact after said liquefying step.

19. The method as claimed in claim 18, wherein said lead is elongated, said elongated lead being bent when said portion of said elongated lead adjacent said contact is moved by said bonding material.

20. The method as claimed in claim 18, wherein said providing step includes providing said lead with a fixed end attached to a first element and a tip end movable with respect to said first element, said contact being attached to a second element, said providing step including juxtaposing said first and second elements so that said tip end of said lead at least partially overlies said contact, whereby said tip end of said lead constitutes the portion of the lead adjacent said contact.

21. The method as claimed in claim 20 further comprising the step of moving said first and second elements away from one another after forming said bond to thereby deform said lead.

22. The method as claimed in claim 20 wherein said first element bears a plurality of leads and said second element bears a plurality of contacts, whereby tip ends of a plurality of leads at least partially overlie a plurality of contacts after said juxtaposing step.

23. The method as claimed in claim 20 wherein said tip end of said lead adheres to said first element prior to said providing step, said providing step including releasing the adhesion between the tip end of the lead and the first element by altering the temperature of the tip end of the lead.

24. The method as claimed in 23 wherein said step of releasing the adhesion is performed after said juxtaposing step.

25. The method as claimed in claim 18, wherein said lead is formed from a metal selected from the group consisting of gold-containing and copper copper-containing metals.

26. The method as claimed in claim 18, wherein said lead has a length of about 1000 microns or less.

27. The method as claimed in claim 26 wherein said lead has is has a thickness about 25 microns or less and a width of about 50 microns or less.

28. A method of making a microelectronic assembly comprising:
   (a) providing a dielectric substrate having a first surface and a lead adhered to said first surface at least at a tip end of said lead;
   (b) connecting said tip end of said lead to an electrical contact on a contact-bearing surface of a microelectronic component thereby creating a microelectronic assembly; and
   (c) altering the temperature of said tip ends of said lead and said substrate through a temperature range sufficient to cause the tip end of the lead to separate from said substrate first surface.

29. The method as claimed in claim 28, wherein said altering the temperature includes heating the leads and substrate.

30. The method as claimed in claim 29, wherein said substrate has a plurality of leads adhering to said first surface at least at a tip end of each said lead, wherein said microelectronic component has a plurality of contacts on said contact-bearing surface, said tip ends of said leads being connected to associated contacts prior to or during said temperature-altering, and wherein each lead tip end separates from said substrate first surface during said temperature-altering.

31. The method as claimed in claim 30, wherein said microelectronic component includes a semiconductor chip.

32. The method as claimed in claim 30 or claim 31, further including disposing an encapsulant between said substrate first surface and said chip.

33. The method as claimed in claim 32, wherein the encapsulant is compliant.

34. The method as claimed in claim 33, wherein the substrate is flexible.

35. The method as claimed in claim 33, wherein the substrate is rigid.

36. The method as claimed in claim 31 or claim 32, wherein said substrate has terminals exposed at a second surface of said substrate opposite said first surface.

37. The method as claimed in claim 36, wherein at least some of said terminals are disposed above said contact-bearing surface of said chip.

38. The method as claimed in claim 37, further including providing a flowable, conductive material on said terminals for further connection to a system substrate.

39. The method as claimed in claim 38, wherein said terminals extend from said first surface to said second surface of said substrate.

40. The method as claimed in claim 38, wherein said substrate has a conductive plane.

41. The method as claimed in claim 32, wherein said microelectronic element includes a plurality of semiconductor chips and said connecting includes connecting said leads to said plurality of said chips.

42. The method as claimed in claim 32, wherein said microelectronic component is a semiconductor wafer comprised of a plurality of integrally connected individual chips each having a plurality of contacts thereon.

43. The method as claimed in claim 33, wherein said substrate has electrical terminals remote from said chips.

44. The method as claimed in claim 43, further including disposing an encapsulant between said substrate first surface and said chips.

45. The method as claimed in claim 44, wherein the encapsulant is compliant.

46. The method as claimed in claim 43 or claim 44, wherein the substrate is flexible.

47. The method as claimed in claim 43 or claim 44, wherein the substrate is rigid.

* * * * *

UNITED STATES PATENT AND TRADEMARK OFFICE
CERTIFICATE OF CORRECTION

PATENT NO. : 6,333,207 B1  Page 1 of 1
DATED : December 25, 2001
INVENTOR(S) : David Light and John W. Smith It is certified that error appears in the above-identified patent and that said Letters Patent is hereby corrected as shown below:

<u>Column 2,</u>
Line 56, "lead" should read -- leads --.

<u>Column 4,</u>
Line 23, after "such", "a" should read -- as --.
Line 51, after "during" delete -- , --.

<u>Column 9,</u>
Line 4, after second occurrence of "to" delete -- , --.
Line 25, after "is" insert -- a --.

<u>Column 10,</u>
Line 8, after "and" delete -- copper --.
Line 12, delete "has is".

Signed and Sealed this

Twenty-eighth Day of May, 2002

*Attest:*

*Attesting Officer*

JAMES E. ROGAN
*Director of the United States Patent and Trademark Office*